(12) United States Patent
Fornara et al.

(10) Patent No.: US 10,475,713 B2
(45) Date of Patent: Nov. 12, 2019

(54) CONTROLLABLE INTEGRATED CAPACITIVE DEVICE

(71) Applicant: STMicroelectronics (Rousset) SAS, Rousset (FR)

(72) Inventors: Pascal Fornara, Pourrières (FR); Christian Rivero, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 169 days.

(21) Appl. No.: 15/648,135

(22) Filed: Jul. 12, 2017

(65) Prior Publication Data

US 2017/0309532 A1    Oct. 26, 2017

Related U.S. Application Data

(62) Division of application No. 14/675,468, filed on Mar. 31, 2015, now Pat. No. 9,721,858.

(30) Foreign Application Priority Data

Jun. 23, 2014 (FR) ...................................... 14 55792

(51) Int. Cl.
*H01L 23/04* (2006.01)
*H01L 23/522* (2006.01)
(Continued)

(52) U.S. Cl.
CPC ............ *H01L 23/04* (2013.01); *B81B 3/0021* (2013.01); *H01G 5/18* (2013.01); *H01L 23/5223* (2013.01);
(Continued)

(58) Field of Classification Search
None
See application file for complete search history.

(56) References Cited

U.S. PATENT DOCUMENTS 5,880,921 A   3/1999 Tham et al.
6,377,438 B1  4/2002 Deane et al.
(Continued)

FOREIGN PATENT DOCUMENTS

EP   2154635 A1   2/2010
EP   2202767 A1   6/2010
(Continued)

OTHER PUBLICATIONS

Definition of layer downloaded from URL< https://www.merriam-webster.com/dictionary/layer> on Apr. 24, 2019 (Year: 2019).*
(Continued)

*Primary Examiner* — J. E. Schoenholtz
(74) *Attorney, Agent, or Firm* — Slater Matsil, LLP (57) ABSTRACT

An integrated circuit includes several metallization levels separated by an insulating region. A hollow housing whose walls comprise metallic portions is produced within various metallization levels. A controllable capacitive device includes a suspended metallic structure situated in the hollow housing within a first metallization level including a first element fixed on two fixing zones of the housing and at least one second element extending in cantilever fashion from the first element and includes a first electrode of the capacitive device. A second electrode includes a first fixed body situated at a second metallization level adjacent to the first metallization level facing the first electrode. The first element is controllable in flexion from a control zone of this first element so as to modify the distance between the two electrodes.

28 Claims, 8 Drawing Sheets

(51) Int. Cl.
  *H01L 49/02* (2006.01)
  *B81B 3/00* (2006.01)
  *H01G 5/18* (2006.01)
  *H01L 27/06* (2006.01)

(52) U.S. Cl.
  CPC ...... *H01L 28/40* (2013.01); *B81B 2201/0221* (2013.01); *H01L 27/0629* (2013.01); *H01L 2924/0002* (2013.01)

(56) References Cited

U.S. PATENT DOCUMENTS

| | | | |
|---|---|---|---|
| 6,498,347 B2 | 12/2002 | Sauer et al. | |
| 7,440,254 B2* | 10/2008 | Gallant | B81B 3/0008 361/272 |
| 7,657,995 B2 | 2/2010 | Hsu et al. | |
| 7,960,804 B1 | 6/2011 | Ebel et al. | |
| 8,264,054 B2 | 9/2012 | Cunningham et al. | |
| 8,310,053 B2 | 11/2012 | Verheijden et al. | |
| 8,313,970 B2 | 11/2012 | Quevy et al. | |
| 8,363,381 B2* | 1/2013 | Shimanouchi | H01G 5/16 361/272 |
| 8,604,898 B2 | 12/2013 | Anderson et al. | |
| 8,609,450 B2 | 12/2013 | Gambino et al. | |
| 8,692,247 B2 | 4/2014 | Fornara et al. | |
| 8,704,327 B2 | 4/2014 | Rivera et al. | |
| 8,884,289 B2 | 11/2014 | Fornara et al. | |
| 2005/0146404 A1 | 7/2005 | Yeatman | |
| 2005/0189204 A1 | 9/2005 | Yeatman et al. | |
| 2006/0285255 A1 | 12/2006 | Kawakubo et al. | |
| 2007/0183116 A1 | 8/2007 | Combi et al. | |
| 2007/0262401 A1 | 11/2007 | Yokoyama et al. | |
| 2008/0093691 A1 | 4/2008 | Busta | |
| 2008/0224241 A1 | 9/2008 | Inaba et al. | |
| 2008/0227286 A1 | 9/2008 | Gaillard | |
| 2010/0116632 A1 | 5/2010 | Smith et al. | |
| 2010/0158072 A1 | 6/2010 | Fornara et al. | |
| 2010/0275904 A1 | 11/2010 | Bathurst et al. | |
| 2011/0037132 A1 | 2/2011 | Hsu et al. | |
| 2011/0037160 A1 | 2/2011 | Hsu et al. | |
| 2011/0051309 A1 | 3/2011 | Furukawa et al. | |
| 2011/0063773 A1 | 3/2011 | Ikehashi | |
| 2012/0009774 A1 | 1/2012 | Fornara et al. | |
| 2012/0134121 A1 | 5/2012 | Kanemoto et al. | |
| 2013/0146873 A1 | 6/2013 | Fornara et al. | |
| 2013/0147004 A1* | 6/2013 | Rivero | H01L 28/40 257/467 |
| 2014/0167908 A1 | 6/2014 | Fornara et al. | |
| 2014/0183014 A1 | 7/2014 | Inoue et al. | |
| 2014/0191385 A1 | 7/2014 | Di-Giacomo | |
| 2014/0266562 A1 | 9/2014 | Di-Giacomo et al. | |
| 2014/0319653 A1 | 10/2014 | Fornara et al. | |
| 2014/0360851 A1 | 12/2014 | Rivero et al. | |

FOREIGN PATENT DOCUMENTS

| | | |
|---|---|---|
| FR | 1350161 A | 1/1964 |
| JP | 10149950 A | 2/1998 |
| JP | 2006238265 A | 9/2006 |
| JP | 2006351296 A | 12/2006 |
| KR | 20110066395 A | 6/2011 |
| WO | 2005069331 A1 | 7/2005 |

OTHER PUBLICATIONS

Definition of level downloaded from URL< https://www.merriam-webster.com/dictionary/level> downloaded on Apr. 24, 2019 (Year: 2019).*

Dereus, D.R. et al., "Tunable Capacitor Series/Shunt Design for Integrated Tunable Wireless Front End Applications," MEMS 2011, Cancun, Mexico, Jan. 23-27, 2011, pp. 805-808.

Kaynak, M. et al., "Characterization of an Embedded RF—MEMS Switch," IEEE, date of conference Jan. 11-13, 2010, pp. 144-147.

Konishi, "Built-In Upwards-Bending Electrostatic Actuator Capable of Three-Level-Structural Variable Capacitor," Transducers & Eurosensors '07, The 14th International Conference on Solid-State Sensors, Actuators and Microsystems, Lyon France, Jun. 10-14, 2007, pp. 447-450.

Vayrette, R. et al., "Residual stress estimation in damascene copper interconnects using embedded sensors," Microelectronic Engineering 87 (2010), May 22, 2009, pp. 412-415.

* cited by examiner

FIG. 13B cross-section view

CONTROLLABLE INTEGRATED CAPACITIVE DEVICE

CROSS-REFERENCE TO RELATED APPLICATIONS

This application is a divisional of U.S. application Ser. No. 14/675,468, filed on Mar. 31, 2015, which claims priority to French Patent Application No. 1455792, filed on Jun. 23, 2014, which applications are hereby incorporated herein by reference.

TECHNICAL FIELD

Embodiments of the invention relate to integrated circuits, and more particularly to the production of integrated controllable capacitive devices, usable, for example, in wireless communication apparatuses, such as cellular mobile telephones, so as to be able to change frequency band in a simple manner.

BACKGROUND

Currently, within integrated circuits there exist controllable capacitive devices produced in the form of micro electromechanical systems (MEMS). It is possible to cite in this regard the article by DeReus and others entitled "Tunable capacitor series/shunt design for integrated tunable wireless front end applications," MEMS 2011, Cancun, Mexico, Jan. 23-27, 2011, 2011 IEEE.

The capacitive device described in this article is based on a structure of the suspended bridge type comprising a metallic membrane disposed some distance from a lower electrode surmounted by a dielectric layer. When the membrane is distant from the dielectric layer, the capacitive device exhibits a first, typically low, capacitive value, while when the membrane is actuated so as to contact the dielectric layer, the metallic membrane/dielectric layer/lower electrode assembly forms a capacitor having a second, typically high, capacitive value.

The control of the flexing of the metallic membrane is performed by applying a high voltage, typically of the order of 50 volts, so as to ensure at one and the same time correct flexing of the mobile electrode and to ensure correct contact with the dielectric layer.

In addition to the fact that the technology used to produce such devices is a dedicated technology, which is difficult to integrate into a CMOS standard technological trend, the necessity to apply a high voltage, of the order of several tens of volts, is a major drawback.

SUMMARY

According to one embodiment, there is proposed a controllable capacitive device disposed at least in part in the interconnection part (commonly referred to by the person skilled in the art by the acronym "BEOL": Back End Of Lines) and which can be produced by all CMOS technological trends by the optional addition of only a few extra operations (the addition of a mask level for example), doing so without using the conventional technology of the MEMS type.

According to one embodiment, there is proposed a controllable capacitive device not requesting a high activation voltage to switch the capacitive device from one configuration to another, while allowing good contact between the mobile electrode of the capacitive device and the fixed electrode.

According to one aspect, there is proposed an integrated circuit comprising, above a substrate, an interconnection part (BEOL comprising several metallization levels separated by an insulating region, commonly referred to by the person skilled in the art by the acronym IMD (Inter Metal Dielectric).

According to a general characteristic of this aspect, the integrated circuit furthermore comprises within the interconnection part, at least one hollow housing whose walls comprise metallic portions produced within various metallization levels, a controllable capacitive device comprising a suspended metallic structure situated in the hollow housing within a first metallization level. This structure comprises a first element fixed on two fixing zones of the housing and at least one second element extending in cantilever fashion from the first element and comprising a first electrode of the capacitive device.

The capacitive device also comprises a second electrode comprising a first fixed body situated at a second metallization level adjacent to the first metallization level facing the first electrode, the first element being controllable in flexion from a control zone of this first element so as to modify the distance between the two electrodes.

It should be noted that the terms "first" and "second" associated with the metallization levels do not in any way prejudge the actual rank of the metallization level concerned and simply make it possible to mutually distinguish them.

The fact of envisaging the first element which is in fact a suspended bridge and which will flex from its control zone, and a second element which extends in cantilever fashion from this first element, that is to say which possesses a free end, and which comprises the first electrode, that is to say the mobile electrode, will make it possible to "decorrelate" the flexing movement of the first element from the substantially linear movement of the second element and lead in particular to requiring a lesser activation force to allow a significant displacement of the mobile electrode.

Thus, the new structure makes it possible to avoid having the flexed capacitive electrode. Only the control zone will flex. And, the fact of avoiding having a flexing of the electrode of the capacitive device makes it possible to more precisely tailor the capacitive value of this device.

Moreover, the first element, its control zone and the second element are advantageously arranged in such a way that the first electrode is capable of moving in a direction substantially orthogonal to the metallization levels while remaining substantially parallel to the second electrode (fixed electrode) during the flexing of the first element.

According to one embodiment, the circuit furthermore comprises a control element configured to apply an electrostatic force on the control zone of the first element so as to make it flex.

In this regard, according to one embodiment, the control element comprises a second fixed body situated at a metallization level adjacent to the first metallization level facing the control zone of the first element and a power supply configured to apply a potential difference between the control zone and the second fixed body.

And, this potential difference can be low, typically a few volts.

It is particularly advantageous that the integrated circuit furthermore comprise a safety mechanism configured to prohibit electrical contact between the control zone of the first element and the second fixed body.

According to one embodiment, the control zone of the first element is situated substantially midway from the two fixing zones respectively situated on two opposite walls of the housing and the second element extends in cantilever fashion from the control zone of the first element.

Such a geometric configuration contributes greatly to obtaining to a displacement substantially perpendicular to the mid-planes of the metallization levels of the mobile electrode.

The second element comprises a beam extending in a different direction from the direction passing through the two fixing zones. Here again, the direction of fixing is "decorrelated" from the direction in which the mobile electrode or electrodes of the capacitive device extends.

It is particularly advantageous that the two fixing zones be opposite one another and that the first element be symmetric with respect to the direction passing through the two fixing zones and that the beam of the second element extend perpendicularly to the direction.

The first element can comprise a first plate fixed on the two fixing zones by two arms and forming the control zone. The first electrode can then comprise a second plate situated in the vicinity of the free end of the beam.

According to one embodiment, the first fixed body and the second fixed body are situated at the second metallization level which is disposed between the first metallization level and the substrate, and the second electrode furthermore comprises an electrically conducting appendage secured to the first fixed body situated between the fixed body and the first electrode and having a height substantially equal to half the space between two metallization levels.

Such an appendage also advantageously forms the safety mechanism mentioned hereinabove.

The capacitive device can comprise a dielectric layer disposed between the two electrodes and fixed on the appendage or on the first electrode.

According to one embodiment, the capacitive device possesses a first configuration, in the absence of flexing of the first element, in which the dielectric layer is distant from the electrode on which it is not fixed, and a second configuration, in the presence of a flexing of the first element, in which the dielectric layer is in contact with the electrode on which it is not fixed, and the first element is controllable in flexion from the control zone so as to toggle the capacitive device from its first configuration to its second configuration.

According to one embodiment, the housing possesses a floor wall situated at the second metallization level and incorporating the first and the second fixed bodies.

The suspended structure can be totally symmetric.

Thus, according to one embodiment, the suspended structure furthermore comprises a third element structurally identical to the second element, extending in cantilever fashion from the first element symmetrically with the second element, and possessing a third electrode structurally identical to the first electrode, and the capacitive device comprises a fourth electrode structurally identical to the second electrode and comprising a third fixed body situated facing the third electrode at the same metallization level as that of the first fixed body, the first element being controllable in flexion from the control zone of this first element so as to simultaneously modify the distance between the first and the second electrodes and the distance between the third and the fourth electrodes.

As a general rule, when the electrostatic force ceases, the suspended structure returns to its rest state by elastic effect.

That said, it is possible, in certain cases, that the mobile electrode may remain stuck to the dielectric. In this case, so as to facilitate the return to the unflexed position of the structure, it is particularly advantageous that the first element comprise a first part situated at the first metallization level and a second part situated at a via level adjacent to the first metallization level, the two parts comprising materials having different coefficients of thermal expansion, the first element being electrically activatable so as to toggle from a flexed configuration to an unflexed configuration, the first part being configured to allow it to be at least in part traversed by an electric current so as to increase its temperature.

BRIEF DESCRIPTION OF THE DRAWINGS

Other advantages and characteristics of the invention will be apparent on examining the detailed description of wholly non-limiting embodiments in which.

DETAILED DESCRIPTION OF ILLUSTRATIVE EMBODIMENTS

Figure 1:
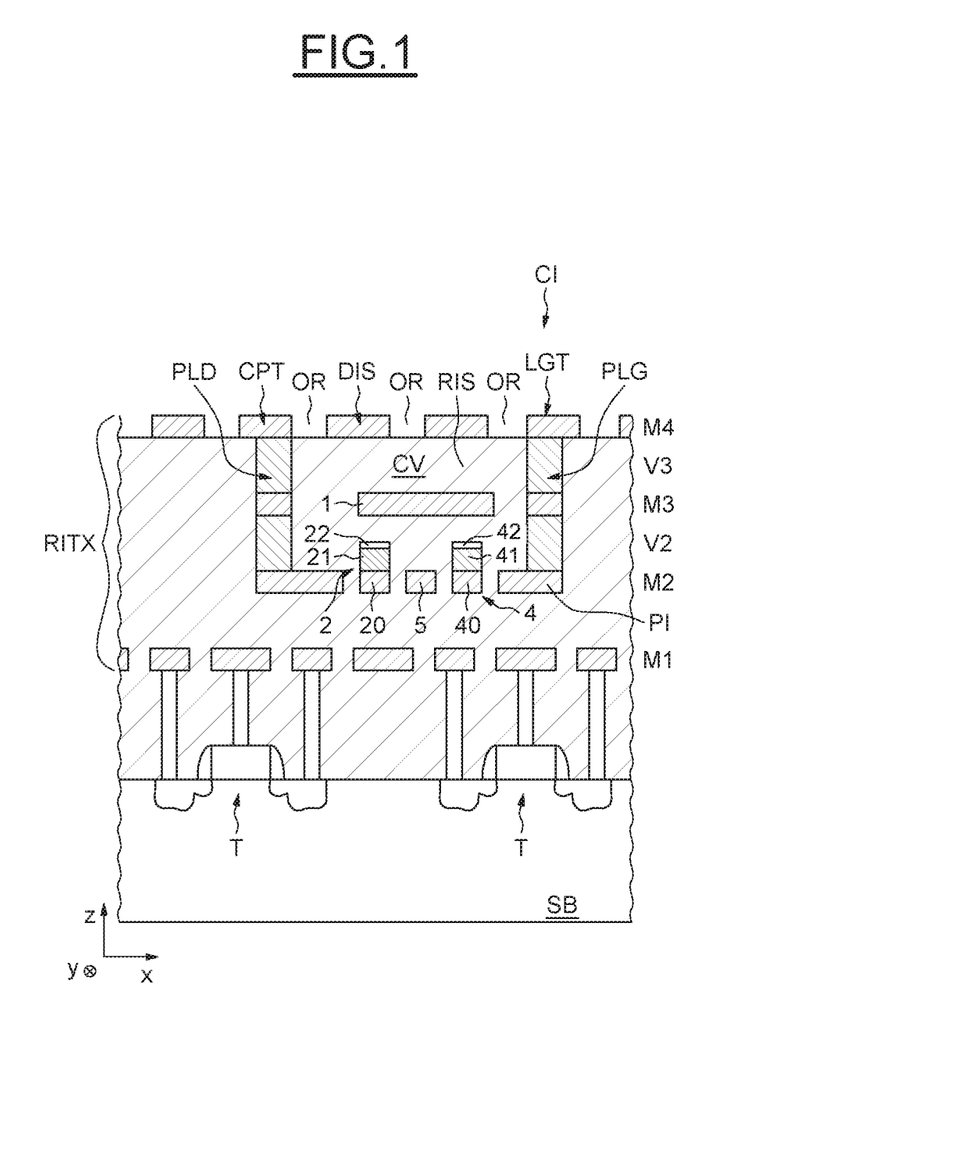
FIG. 1 is a cross-section view of an embodiment integrated circuit.

In FIG. 1, the reference CI designates an integrated circuit within which we shall produce a controllable capacitive device DIS comprising a suspended structure 1 housed in a cavity CV of a hollow housing LGT.

As will be seen in greater detail hereinafter, the metallic device DIS and the housing LGT are produced within several metallization levels or metal levels (here three metallization levels M2, M3, M4, and two levels of vias V2, V3) of the interconnection part RITX of the integrated circuit CI, this interconnection part commonly being referred to by the person skilled in the art by the acronym BEOL ("Back End Of the Line").

This interconnection part is situated above the substrate SB of the integrated circuit and above the components, such as transistors T, produced in and on the substrate SB.

As is conventional in this regard, some of the metallic tracks produced within the various metallization levels of the integrated circuit are mutually linked by interconnection perforations or vias, the whole set of these tracks and vias being encapsulated in an insulating region RIS, which can be formed of one or more electrically insulating materials.

The housing LGT comprises in particular a lower wall PI produced at the metal level M2, a lateral wall PLD produced at the via level V2, at the metal level M3 and at the via level V3, as well as another wall PLG also produced at the via level V2 at the metal level M3 and at the via level V3.

The housing LGT is closed by a perforated cowl CPT comprising several orifices OR. The cowl CPT is produced here at the metal level M4.

As will be seen in greater detail hereinafter, the structure 1 is initially encapsulated in the insulating material RIS of the interconnection part RITX and then, subsequently, after withdrawal of this material RIS from the cavity CV of the housing, freed.

Whereas the suspended structure 1 is produced at the metal level M3, the capacitive device also comprises a first fixed body 20 situated at the metal level M2, adjacent to the metal level M3, a second fixed body 5, also produced at the metal level M2 and a third fixed body 40 also produced at the metal level M2. These fixed bodies therefore form part of the lower wall PI of the housing.

The first fixed body 20 is surmounted by an appendage 21 having the height of a half via. This appendage 21 supports a layer 22 comprising a dielectric material different from the insulating material RIS.

Likewise, the third fixed body 40 supports an electrically conducting appendage 41, analogous to the appendage 21.

The appendage 41 also supports another layer 42 comprising a dielectric material.

As will be seen in greater detail hereinafter, whereas the suspended structure 1 comprises first and third electrodes of the capacitive device, these electrodes being mobile electrodes, the first fixed body 20 and the appendage 21 form a second electrode of the capacitive device, while the third fixed body 40 and the appendage 41 form a fourth electrode 4 of the capacitive device. These second and fourth electrodes 2 and 4 are fixed electrodes.

Figure 2A:
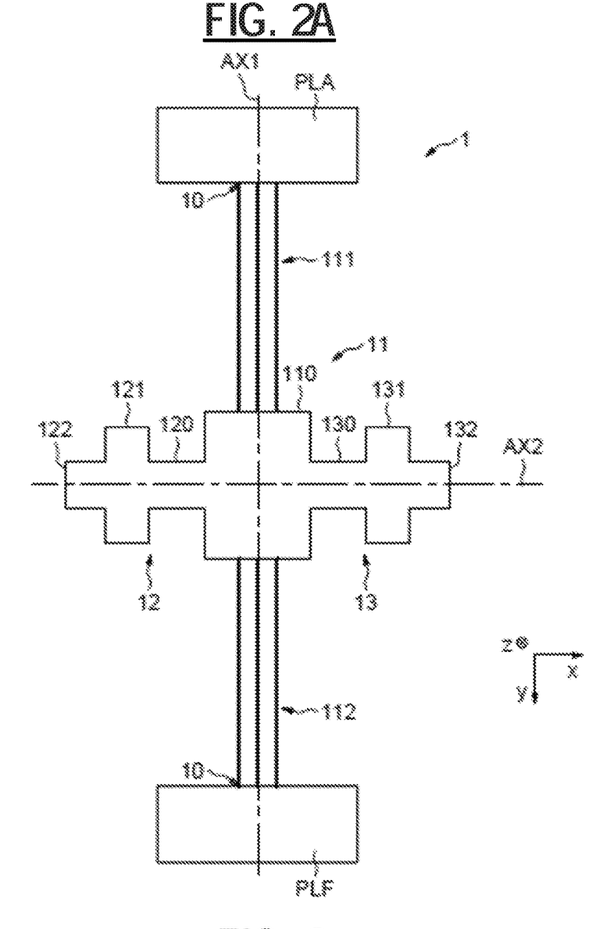
FIG. 2A is a plan view of the embodiment integrated circuit.

FIG. 2A is a view from above of the metal level M3 illustrating in greater detail an exemplary embodiment of the structure 1.

Figure 2B:
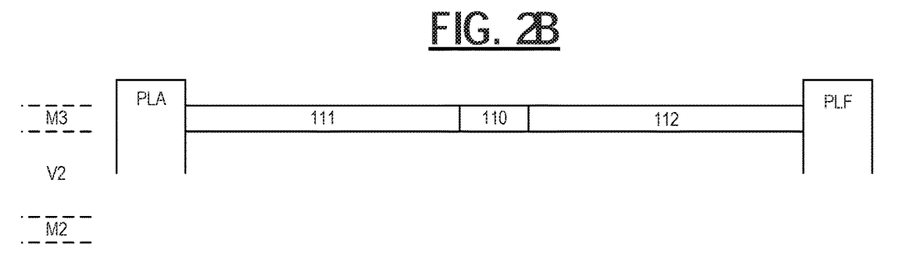
FIG. 2B is another cross-section view of the embodiment integrated circuit.

The housing LGT comprises, in addition to the wall PLD and the wall PLG, two other walls PLA and PLF, as shown in FIG. 2B.

In the example of FIG. 2A, the suspended structure 1 possesses a longitudinal axis of symmetry AX1 and a transverse axis of symmetry AX2.

This structure is here cross shaped and comprises a first element 11, a second element 12 and a third element 13 structurally identical to the second element 12.

The first element 11 comprises here a first metallic plate 110 fixed on two fixing zones 10 respectively situated on the walls PLA and PLF by two arms 111 and 112, each arm comprising here three branches. This first plate 110 forms here a control zone for the first element. Of course the number three of branches of each arm is here only an example and this number may be arbitrary. Provision may thus for example be made for a single branch optionally perforated here and there.

The second element 12 comprises a beam 120 extending in cantilever fashion from the first plate 110 perpendicularly to the axis AX1.

The second element 12 comprises a second plate 121 situated in the vicinity of the free end 122 of the beam 120.

The third element 13 comprises by analogy a beam 130 extending in cantilever fashion from the other side of the first plate 110.

This beam 130 comprises a third plate 131 situated in the vicinity of the free end 132 of the beam 130.

After the structure 1 is subsequently de-encapsulated, that is to say after the material RIS inside the cavity CVT has been removed, the structure 1 then becomes a suspended structure whose first element 11 is capable of flexing in the plane xz as illustrated schematically in FIG. 6. This characteristic will be returned to in greater detail hereinafter.

Figure 3:
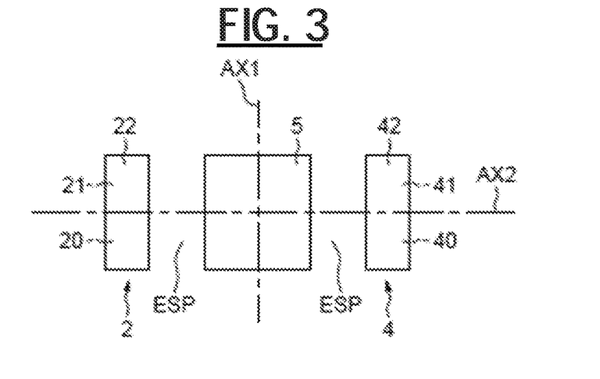
FIG. 3 is yet another cross-section view of the embodiment integrated circuit.

FIG. 3 illustrates in greater detail a view from above of the dielectric layers 22 and 42 as well as of the second fixed body 5.

The second dielectric layer 22 which overlaps the appendage 21 and the first fixed body 20 is situated opposite the second plate 121. Likewise, the dielectric layer 42 which overlaps the appendage 41 and the third fixed body 40 is situated opposite the third plate 131. Moreover, the second fixed body 5 is situated opposite the first plate 110.

It should be noted that the various fixed bodies 20, 5 and 40 are mutually electrically insulated since they are separated, after withdrawal of the material RIS from the cavity, by spaces ESP. Likewise, the first fixed body 20 and the third fixed body 40 are respectively insulated from the remainder of the lower wall PI by other air spaces.

Thus, the capacitive device 1 comprises a first capacitor whose first, mobile, electrode comprises the second plate 121, whose second fixed electrode, comprises the appendage 21 supported by the fixed body 20 and whose dielectric comprises the dielectric layer 22 as well as, after de-encapsulation of the structure and in a first configuration, the air space lying between the dielectric layer 22 and the plate 121.

Likewise, in this embodiment, the capacitive device comprises another mobile electrode comprising the plate 131, another fixed electrode 4 comprising the appendage 41 surmounted by the fixed body 40, and the dielectric comprising the dielectric layer 42 and the air space situated between this dielectric layer 42 and the plate 131 in the first configuration after de-encapsulation.

Moreover, as will be explained in greater detail hereinafter, the first element 11 is controllable in flexion from the control zone formed here of the first plate 110 cooperating, in this embodiment, in an electrostatic manner with the second fixed body 5.

Figure 4:
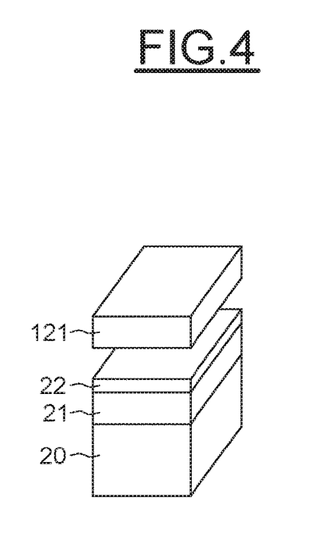
FIGS. 4-5 are three-dimensional cross-section views of the embodiment integrated circuit.
Figure 5:
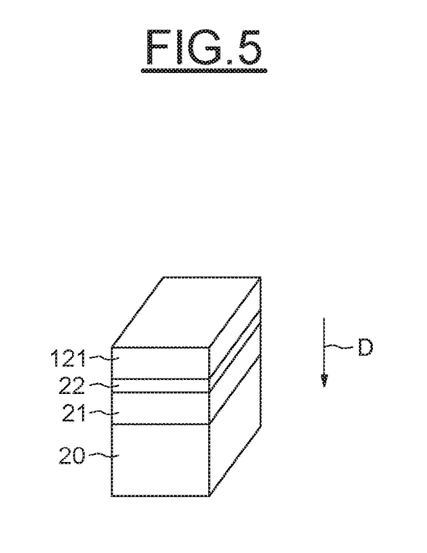
Figure 6:
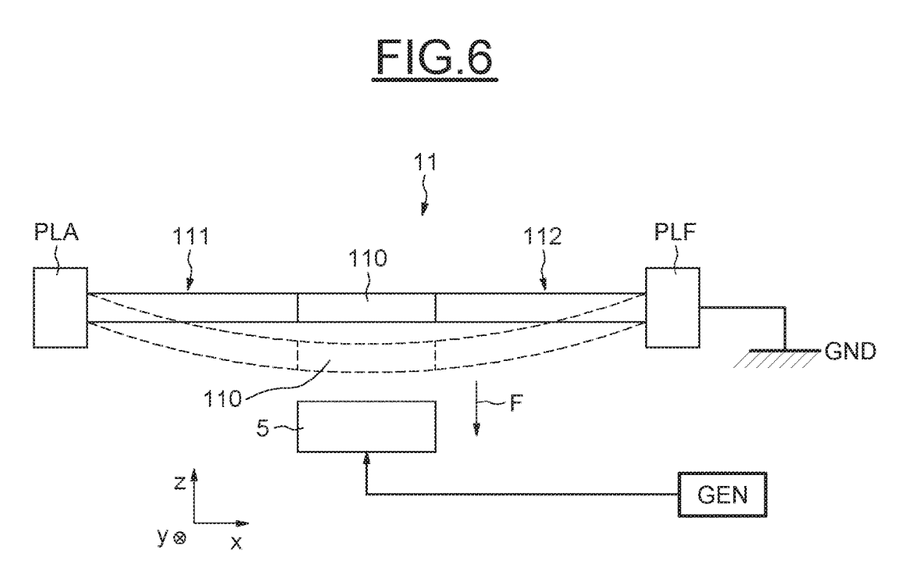
FIG. 6 is a representation of the flexing of the embodiment integrated circuit.

As illustrated in FIGS. 4 to 6, the capacitive device DIS possesses after withdrawal of the insulating material RIS a first configuration in which the first element 11 is not flexed leading to a mobile electrode 121 situated some distance from the dielectric layer 22 (FIG. 4). This applies of course also to the other mobile electrode comprising the plate 131. In this configuration, the capacitive value of the capacitor is low.

The capacitive device also possesses a second configuration in which, in this example, subsequent to a vertical displacement along the direction D of the plate 121 resulting from a flexing of the first element 11, the plate 121 comes into contact with the dielectric layer 22 thus affording the corresponding capacitor a higher capacitive value.

In this regard, as illustrated in FIG. 6, the flexing of the first element 11 is caused by the electrostatic force F resulting from the application of a potential difference between the second fixed body 5 and the first plate 110.

Typically, a voltage generation circuit GEN of conventional structure known per se is configured to apply a voltage Vdd on the second fixed body 5.

The walls of the housing and therefore the structure 1 and as a consequence the first plate 110 are linked to ground GND.

The control element is configured to cause the first element 11 to flex therefore here comprise the generation circuit GEN, the second fixed body 5 and the plate 110.

This flexing of the first element causes the vertical displacement along the direction D of the mobile electrodes of the capacitive device.

Moreover, in the embodiment described here, the appendages 21 and 41, whose height is the height of a half via also form a safety mechanism making it possible to prohibit electrical contact between the control zone, that is to say the first plate 110, of the first element and the second fixed body 5.

Thus, the fact of placing the mobile electrodes in a different direction from the direction of fixing of the first element, makes it possible to dissociate the flexural movement of the first element from the vertical displacement of the mobile electrodes. It is therefore no longer necessary to provide a large control voltage in order to cause the suspended bridge to flex, nor necessary to obtain a good area of contact surface between the two electrodes of the capacitor. Indeed, in the embodiment described here, a voltage Vdd of a few volts is, by virtue of the flexing of the first element, sufficient to displace the mobile electrodes 121 and 131 vertically so as to bring them into contact with the corresponding dielectric layers.

More precisely with a structure of the type of that illustrated in FIG. 2 having arms of three branches of length 25 µm and of width 2 µm and a plate 110 of area 130 µm$^2$ it suffices to apply a voltage Vdd of the order of 2.5 Volts to displace the mobile electrodes so as to bring them into contact with the corresponding dielectric layers.

The voltage Vdd can be brought to the fixed body 5, for example, by use in particular of a via situated under the metal level M2.

Reference is now made more particularly to FIGS. 7 to 11 to illustrate a mode of fabrication of an exemplary embodiment of a device according to the invention.

The device DIS and in particular the suspended structure 1 are produced using conventional steps for fabricating metallization levels and vias.

The metallic elements of the metal level M2 forming the lower wall PI of the housing are defined firstly (FIG. 7) in a conventional manner known per se.

Figure 7:
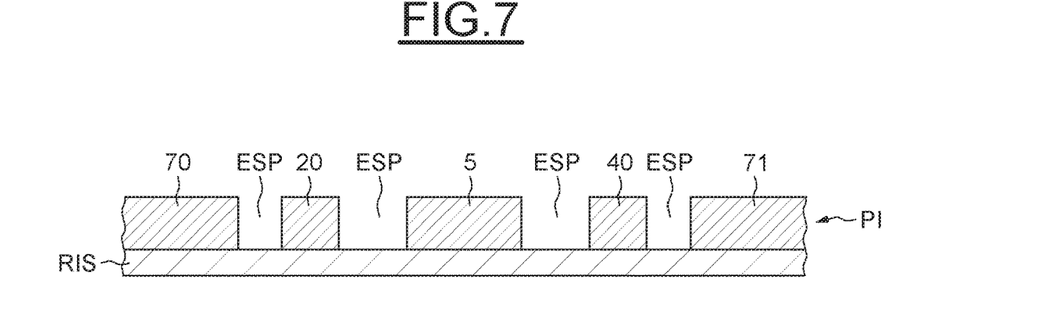
FIGS. 7-12 are representations of fabrication of the embodiment integrated circuit.
Figure 8:
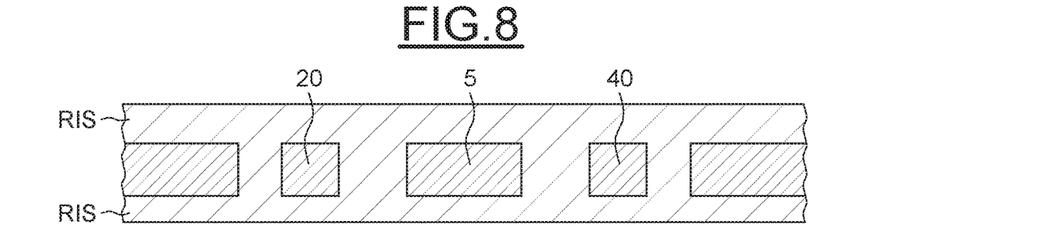

The metal level M2 which rests on the subjacent insulating region RIS thus comprises the three fixed bodies 20, 5 and 40 mutually spaced apart by the spaces ESP, as well as metallic portions 70 and 71 respectively spaced from the fixed bodies 20 and 40 by other spaces ESP.

The height of this metal level and of each metal level is typically between 3000 and 5000 Å.

In the following step (FIG. 8), the metal level M2 is shrouded with an insulating material RIS, comprising for example silicon dioxide, so as to form above the metal level M2 an insulating region RIS height equal to half an inter metal level space. This is performed in a conventional manner for example by deposition of the insulating material, followed by a mechanical-chemical polishing.

Next, the two appendages 21 and 41 are produced (FIG. 9) by photolithography, etching and deposition of metal, typically tungsten, followed by a mechanical-chemical polishing. The height of these appendages is of the order of 2500 Å for example, this corresponding to half a via height, for example of the order of 5000 Å.

Figure 9:
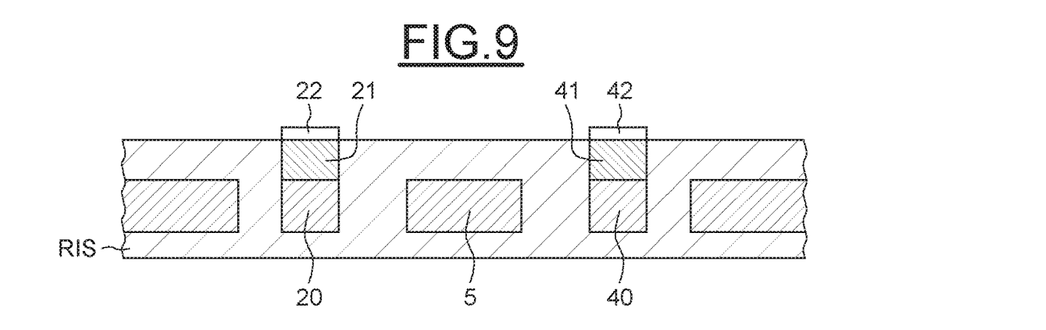

The two dielectric layers 22 and 42 are thereafter formed on the two appendages 21 and 41, typically by deposition and etching. The dielectric material used can be silicon nitride.

The height of these layers 22 and 42 is for example of the order of 300 Å.

The inter-metal insulating region RIS is thereafter completed (FIG. 10) and two vias V20 and V21 are formed in a conventional manner known per se.

Figure 10:
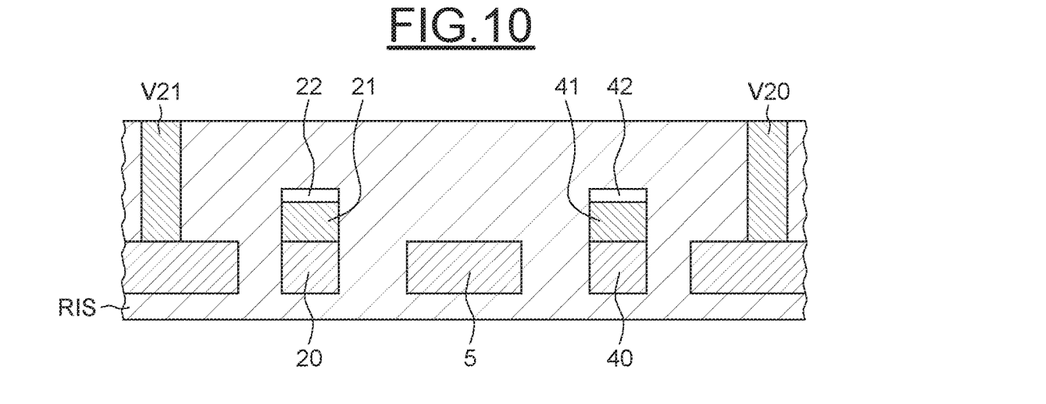

As indicated hereinabove, the height of these vias V20 and V21 may typically be between 3000 and 5000 Å.

Figure 11:
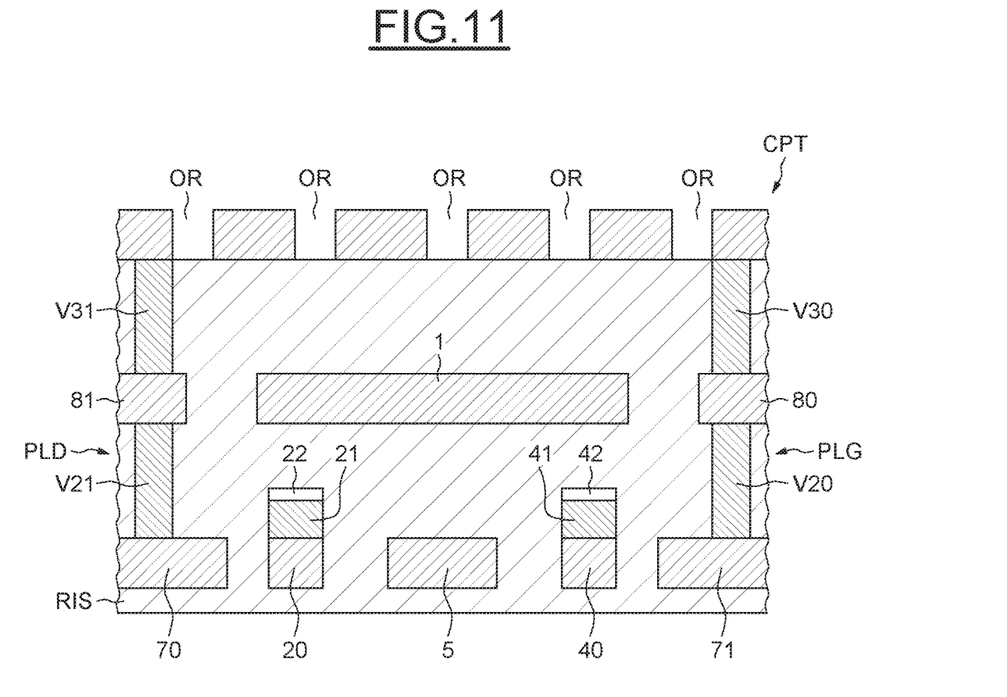

Next, as illustrated in FIG. 11, we define the metal level M3 which comprises the suspended structure 1 as well as two metallic portions 80 and 81 above the vias V20 and V21.

Thereafter the intermetal dielectric region RIS situated between the metal level M3 and the metal level M4 is produced and vias V30 and V31 are formed above the metallic portions 21 and 81 so as to finalize the walls PLD and PLG.

Thereafter the metallization level M4 is produced so as to define the cowl CPT comprising the orifices OR.

Next, in this example (FIG. 12) a wet etching FL is then undertaken, for example with hydrofluoric acid, through the orifices OR so as to eliminate the insulating region RIS encapsulating the structure 1 and the various fixed bodies and to thereby produce the cavity CV of the housing LGT.

Figure 12:
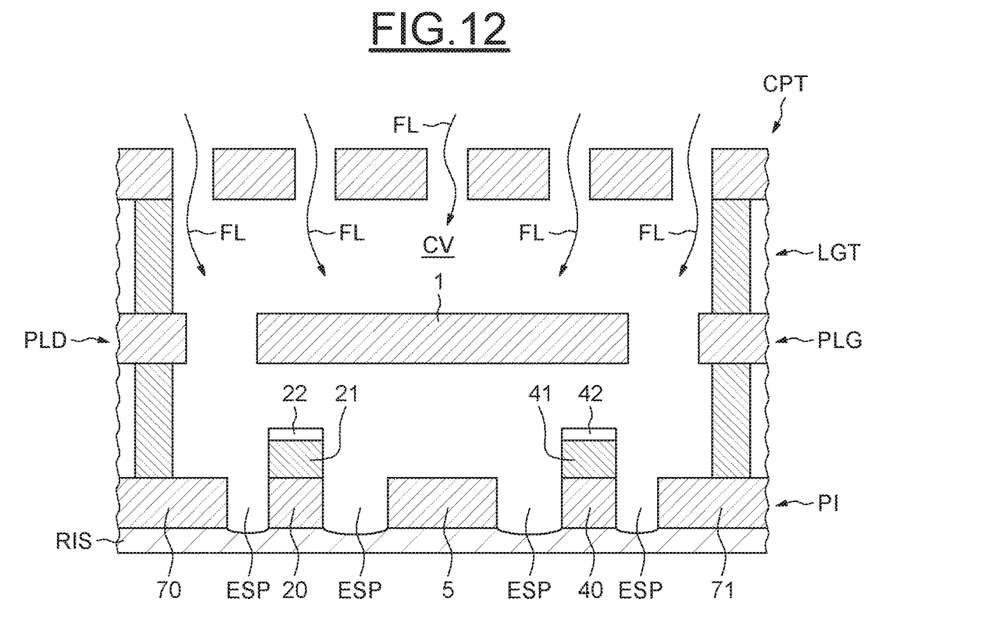

Next, a non-conformal deposition of oxide is undertaken so as to form a layer plugging the orifices OR.

The conventional method for producing the various upper metallization levels is continued thereafter.

The device DIS can be used in a radiofrequency communication apparatus, for example a cellular mobile telephone, so as, by modifying the capacitive value, to modify the frequency band of the cellular mobile telephone.

In such an application, the radiofrequency signal can flow within the fixed electrodes of the capacitors and more particularly within the fixed bodies 20 and 40.

Of course, several capacitive devices of this kind can be disposed within one and the same integrated circuit so as to be able to cover different frequency bands.

The toggling of the capacitive device from its second configuration to its first configuration, that is to say that in which the first element is unflexed, occurs by elastic effect of this first element, cancelling the potential difference between the fixed body 5 and the control zone 110 of the first element.

That said, it may happen in certain cases that, by sticking effect, the mobile electrode remains stuck on the corresponding dielectric layer preventing natural return to the first configuration.

Figure 13A:
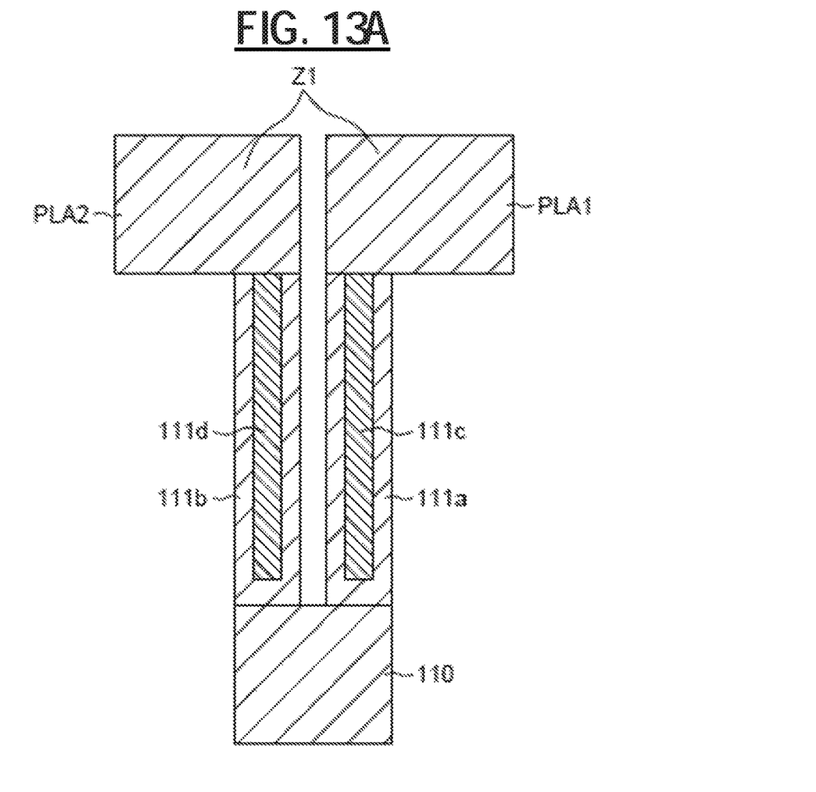
FIG. 13A is another cross-section view of the embodiment integrated circuit.

In this case, provision is advantageously made to use the embodiment illustrated schematically in FIG. 13A.

The first element then comprises a first part comprising for example the two arms 111a and 111b, produced at the metal level M3 and forming with the control plate 110 a U. These two arms are joined respectively to two mutually electrically insulated portions PLA1 and PLA2 of the wall PLA.

Figure 13B:
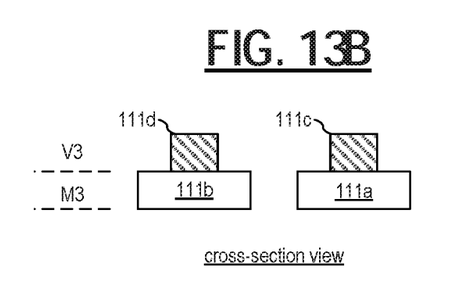
FIG. 13B is yet another cross-section view of the embodiment integrated circuit.

The first element also comprises a second part situated at the via level V3 adjacent to the metal level M3. This second part comprises here two metal lines 111c and 111d secured to the arms 111a and 111b, as shown in FIG. 13B, but produced from materials having different coefficients of thermal expansion. It is for example possible to use aluminum for the arms 111a and 111b and tungsten for the metallic lines 111c and 111d. That said, the use of copper for the arms 111a and 111b is also possible.

Figure 14:
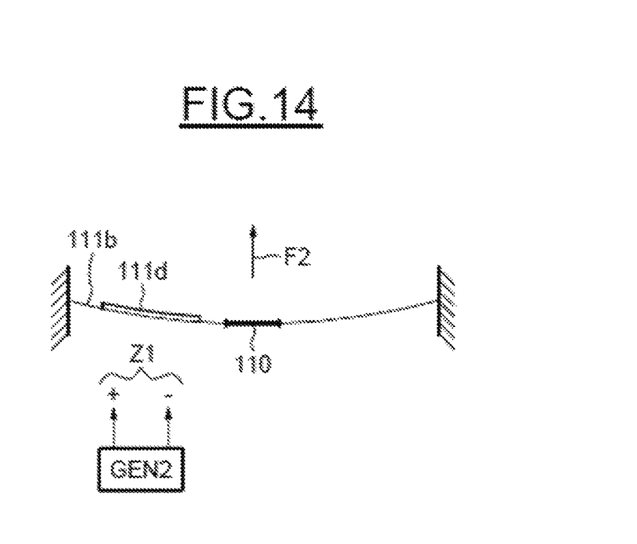
FIG. 14 is a flexing representation of the embodiment integrated circuit.

And, as illustrated in FIG. 14, when the first element is in the flexed position, a potential difference is then applied to the zone Z1, that is to say to the two pieces of wall PLA1 and PLA2, with the aid of conventional circuitry GEN2, so as to cause the flow of a current flowing in the arm 111b, the plate 110 and the arm 111a so as to raise the temperature of the whole assembly through the Joule effect. And, having regard to the different coefficients of thermal expansion of the two materials forming on the one hand the arms 111a and 111b and on the other hand the metallic lines 111c and 111d, there is a mechanical flexion effect exerted in reverse along the direction of the arrow F2 (FIG. 14) so as to restore the first element in a forced manner to its first unflexed configuration.

The invention is not limited to the embodiments which have just been described but embraces all variants thereof.

Thus, although it is particularly advantageous to use a totally symmetric suspended structure 1, it would be possible to make provision for just a single cantilevered beam 120 not necessarily extending perpendicularly to the axis AX1.

Moreover, the plate 121 could be situated completely at the free end of the beam 120.

Likewise the fixed bodies 20, 5 and 41 could be situated within a metal level in the cavity CV of the housing, the lower wall then being situated at a lower metal level. The connections to these fixed bodies would then be performed through the lower wall by means of vias in particular.

The dielectric layer of the capacitors could be fixed under the mobile electrodes.

It would also be possible to envisage a configuration in which the mobile electrodes come into the vicinity of the dielectric layers without contacting them.

It would also be possible to use as suspended structure, a structure of the type of that described in French patent application No. 2 984 009 (U.S. counterpart publication 2013/146873) comprising an asymmetric cross equipped with one or with two cantilevered beams. In this case, as explained in the aforementioned patent application, during de-encapsulation there is a relaxation of the stresses which causes a residual longitudinal deformation of the arms causing a clockwise deviation of the beam or beams. It would then be simplest to slightly shift the corresponding fixed body or bodies situated at the level of the lower wall PI so that they are properly opposite the mobile electrodes borne by the beams after de-encapsulation of the structure.

Finally, even if not indispensable, it is particularly advantageous to equip the housing with an external feature located at the level of the various spaces ESP and forming an obstacle to the diffusion of the structure de-encapsulation fluid during the wet etching FL. External features such as these have been, for example, described in French patent application No. 13 50161 (U.S. counterpart application Ser. No. 14/148,884, published as 2014/0191385).

Example embodiments of the present invention are summarized here. These examples are described with respect to FIGS. 1, 2A, 3, 4, 5, 6, 13A, and 14.

Example 1

An integrated circuit (CI in FIG. 1) including a substrate (SB in FIG. 1); a first metal layer (M2 in FIG. 1) disposed horizontally over the substrate (SB in FIG. 1); a second metal layer (M3 in FIG. 1) disposed horizontally over the first metal layer (M2 in FIG. 1); and a controllable capacitive device (DIS in FIG. 1) including a first element (11 in FIG. 2A) extending between a first metallic wall (PLA in FIG. 2A) and a second metallic wall (PLF in FIG. 2A), the first metallic wall (PLA in FIG. 2A) and the second metallic wall (PLF in FIG. 2A) extending vertically between the first metal layer (M2 in FIG. 1) and the second metal layer (M3 in FIG. 1); where the first metallic wall (PLA in FIG. 2A) includes a first part (PLA1 in FIG. 13A), and a second part (PLA2 in FIG. 13A) electrically insulated from the first part (PLA1 in FIG. 13A); and where the first element (11 in FIG. 2A) includes: a control plate (110 in FIG. 13A) located substantially midway between the first metallic wall (PLA in FIG. 2A) and the second metallic wall (PLF in FIG. 2A), a first arm (11a in FIG. 13A) located within the second metal layer (M3 in FIG. 1) and extending between the control plate (110 in FIG. 13A) and the first part (PLA1 in FIG. 13A) of the first metallic wall (PLA in FIG. 2A), and a second arm (111b in FIG. 13A) located within the second metal layer (M3 in FIG. 1) and extending between the control plate (110 in FIG. 13A) and the second part (PLA2 in FIG. 13A) of the first metallic wall (PLA in FIG. 2A), the first arm (111a in FIG. 13A) being spaced from the second arm (111b in FIG. 13A).

Example 2

The integrated circuit (CI in FIG. 1) of example 1, where the first element (11 in FIG. 2A) further includes a first metal line (111c in FIG. 13A) located in a third layer (V3 in FIG. 1) disposed over the second metal layer (M3 in FIG. 1) and secured to the first arm (111a in FIG. 13A); and a second metal line (111d in FIG. 13A) located in the third layer (V3 in FIG. 1) and secured to the second arm (111b in FIG. 13A), the first metal line (111c in FIG. 13A) formed of a material having a different coefficient of thermal expansion than the first arm (111a in FIG. 13A) and the second metal line (111d in FIG. 13A) formed of a material having a different coefficient of thermal expansion than the second arm (111b in FIG. 13A).

Example 3

The integrated circuit (CI in FIG. 1) of example 2, where the first arm (111a in FIG. 13A) includes aluminum and the first metal line (111c in FIG. 13A) includes tungsten.

Example 4

The integrated circuit (CI in FIG. 1) of example 2, where the first arm (111a in FIG. 13A) includes copper.

Example 5

The integrated circuit (CI in FIG. 1) of example 4, further including a first generator circuit (GEN2 in FIG. 14), coupled between the first part (PLA1 in FIG. 13A) of the first metallic wall (PLA in FIG. 2A) and the second part (PLA2 in FIG. 13A) of the first metallic wall (PLA in FIG. 2A).

Example 6

The integrated circuit (CI in FIG. 1) of example 5, where the first generator circuit (GEN2 in FIG. 14) is configured to raise a temperature of the controllable capacitive device (DIS in FIG. 1) by inducing a current that flows through the first arm (111a in FIG. 13A), the control plate (110 in FIG. 13A), and the second arm (111b in FIG. 13A).

Example 7

The integrated circuit (CI in FIG. 1) of example 1, where the controllable capacitive device (DIS in FIG. 1) further includes: a second element (12 in FIG. 2A) extending for a first length (non-zero distance between control plate (110 in FIG. 13A) and the second element (12) in cantilever fashion from the control plate (110 in FIG. 13A), the second element (12 in FIG. 2A) including a movable electrode (121 in FIG. 2A); a fixed electrode (20 in FIGS. 4-5) located at the first metal layer (M2 in FIG. 1) and facing the movable electrode (121 in FIG. 2A); and a fixed control electrode (5 in FIG. 3) located at the first metal layer (M2 in FIG. 1) and facing the control plate (110 in FIG. 13A).

Example 8

The integrated circuit (CI in FIG. 1) of example 7, where the second element (12 in FIG. 2A) has a first width in a direction perpendicular to the first length, the movable electrode (121 in FIG. 2A) has a second width in a direction parallel to the first width, the second width being larger than the first width.

Example 9

The integrated circuit (CI in FIG. 1) of example 7, where the first element (11 in FIG. 2A) is controllable in flexion from the control plate (110 in FIG. 13A).

Example 10

The integrated circuit (CI in FIG. 1) of example 9, further including a second generator circuit (GEN in FIG. 6) configured to control a distance (D in FIG. 6) between the movable electrode (121 in FIG. 2A) and the fixed electrode (20 in FIGS. 4-5) by applying a voltage to the fixed control electrode (5 in FIG. 3).

Example 11

An integrated circuit (CI in FIG. 1) including: a substrate (SB in FIG. 1); a first metal layer (M2 in FIG. 1) disposed over the substrate (SB in FIG. 1); a second metal layer (M3 in FIG. 1) disposed over the first metal layer (M2 in FIG. 1); and a controllable capacitive device (DIS in FIG. 1) including a first element (11 in FIG. 2A) extending between a first fixing zone (10 next to PLA in FIG. 2A) and a second fixing zone (10 next to PLF in FIG. 2A), the first element (11 in FIG. 2A) being controllable in flexion from a control zone, the first element (11 in FIG. 2A) including: a first arm (111a in FIG. 13A), a second arm (111b in FIG. 13A) spaced from the first arm (111a in FIG. 13A), the first arm (111a in FIG. 13A) and second arm (111b in FIG. 13A) forming a U shape ("U Shape" formed by first arm (111a in FIG. 13A), second arm (111b in FIG. 13A), and control plate (110 in FIG. 13A)) with the control zone, a first metal line (111c in FIG. 13A) located in a third layer (V3 in FIG. 1) disposed over the second metal layer (M3 in FIG. 1) and secured to the first arm (111a in FIG. 13A), and a second metal line (111d in FIG. 13A) located in the third layer (V3 in FIG. 1) and secured to the second arm (111b in FIG. 13A), the first metal line (111c in FIG. 13A) formed of a material having a different coefficient of thermal expansion than the first arm (111a in FIG. 13A) and the second metal line (111d in FIG. 13A) formed of a material having a different coefficient of thermal expansion than the second arm (111b in FIG. 13A).

Example 12

The integrated circuit (CI in FIG. 1) of example 11, where the first arm (111a in FIG. 13A) includes aluminum and the first metal line (111c in FIG. 13A) includes tungsten.

Example 13

The integrated circuit (CI in FIG. 1) of example 11, further including a first generator circuit (GEN2 in FIG. 14) configured to raise a temperature of the controllable capacitive device (DIS in FIG. 1) by inducing a current that flows through the first arm (111a in FIG. 13A) and the second arm (111b in FIG. 13A).

Example 14

The integrated circuit (CI in FIG. 1) of example 11, where the controllable capacitive device (DIS in FIG. 1) further includes a second element (12 in FIG. 2A) extending in cantilever fashion from the control zone, the second element (12 in FIG. 2A) including a movable plate (121 in FIG. 2A) at a free end of the second element (12 in FIG. 2A).

Example 15

The integrated circuit (CI in FIG. 1) of example 14, where the controllable capacitive device (DIS in FIG. 1) further includes: a fixed electrode (20 in FIGS. 4-5) facing the movable plate (121 in FIGS. 4-5); and a fixed control electrode (5 in FIG. 3) facing the control zone.

Example 16

The integrated circuit (CI in FIG. 1) of example 14, where the first element (11 in FIG. 2A) has a first width and a first length, the first length being larger than the first width; the second element (12 in FIG. 2A) has a second width measured in a direction parallel to the first length; and the movable plate having a third width measured in a direction parallel to the second width, the third width being larger than the second width.

Example 17

An integrated circuit (CI in FIG. 1) including: a substrate (SB in FIG. 1); a first metal layer (M2 in FIG. 1) disposed over the substrate (SB in FIG. 1); a second metal layer (M3 in FIG. 1) disposed over the first metal layer (M2 in FIG. 1); and a controllable capacitive device (DIS in FIG. 1) including: a first element (11 in FIG. 2A) extending in a first direction between a first fixing zone (10 next to PLA) and a second fixing zone (10 next to PLF) and suspended over a fixed control electrode (5 in FIG. 3), the first element (11 in FIG. 2A) including a control plate (110 in FIG. 13A) facing the fixed control electrode (5 in FIG. 3), a first arm (111a in FIG. 13A) formed of a first material having a first coefficient of thermal expansion coefficient, and a first metal line (11c in FIG. 13A) secured to the first arm (111a in FIG. 13A) and formed of a second material having a second coefficient of thermal expansion coefficient, the first coefficient of thermal expansion coefficient being different than the second coefficient of thermal expansion coefficient, and a second element (12 in FIG. 2A) extending in cantilever fashion from the control plate (110 in FIG. 13A) and having a first width measured on the first direction, the second element (12 in FIG. 2A) including a movable plate (121 in FIG. 2A) at a free end (122 in FIG. 2A) of the second element (12 in FIG. 2A), the movable plate (121 in FIG. 2A) having a second width measured on the first direction, where the second width is larger than the first width.

Example 18

The integrated circuit (CI in FIG. 1) of example 17, where the first arm (111a in FIG. 13A) includes aluminum and the first metal line (111c in FIG. 13A) includes tungsten.

Example 19

The integrated circuit (CI in FIG. 1) of example 17, further including a first generator circuit (GEN2 in FIG. 14) configured to raise a temperature of the controllable capacitive device (DIS in FIG. 1) by inducing a current that flows through the first arm (111a in FIG. 13A).

Example 20

The integrated circuit (CI in FIG. 1) of example 17, further including a second generator circuit (GEN in FIG. 6) configured to control a distance (D in FIG. 6) between the movable plate (121 in FIGS. 4-5) and a fixed electrode (20 in FIGS. 4-5) by applying a voltage to the fixed control electrode (5 in FIG. 3).

Example 21

A method of fabricating an integrated circuit, the method including: disposing a first metal layer over an insulating region, where the first metal layer forms a lower wall, and where the first metal layer includes a first fixed body, a second fixed body, a third fixed body, a first metallic portion, and a second metallic portion, where the first fixed body, the second fixed body, the third fixed body, the first metallic portion and the second metallic portion are spaced apart from each other; forming a first insulating layer over the first metallic portion; forming a first appendage over the first fixed body and a second appendage over the second fixed body; forming a first dielectric portion over the first appendage and a second dielectric portion over the second appendage; forming a second insulating layer over the first insulating layer and over the first and second dielectric portions, where the first insulating layer and the second insulating layer form a first inter-metal insulating region; forming a first via over the first metallic portion and a second via over the second metallic portion; disposing a second metal layer over the first inter-metal insulating region, where the second metal layer includes a third metallic portion disposed over the first via, a fourth metallic portion disposed over the second via, and a suspended structure; forming a second inter-metal insulating region over the second metal layer; forming a third via over the third metallic portion and a fourth via over the fourth metallic portion, where the first via, third metallic portion and third via form a first wall, and the second via, fourth metallic portion, and fourth via form a second wall; forming a third metal layer over the second inter-metal insulating region, where the third metal layer including orifices, where the third metal layer forms a cowl, and where the lower wall, the first wall, the second wall, and the cowl form a housing; and removing the first and second inter-metal insulating region to form a cavity in the housing to form a hollow housing.

Example 22

The method of example 21, where the first inter-metal insulating region includes silicon dioxide, and the first and second dielectric portions comprise silicon nitride.

Example 23

The method of example 21, where forming the first appendage and the second appendage includes etching and deposition of metal followed by mechanical-chemical polishing.

Example 24

The method of example 21, where removing the first and second dielectric portions comprise silicon nitride includes performing a wet etching step.

Example 25

The method of example 24, where performing the wet etching step includes flowing hydrofluoric acid through the orifices.

Example 26

The method of example 21, further including: forming a third wall and a fourth wall opposite the third wall, where the hollow housing further includes the third and fourth walls, and where the second metal layer further includes a first element extending from the third wall to the fourth wall, the first element including a control plate facing the third fixed body, the third fixed body disposed between the first fixed body and the second fixed body.

Example 27

The method of example 26, where the third wall includes a first part and a second part electrically insulated from the first part, and where the first element further includes: a first arm extending from the control plate to the first part of the third wall; and a second arm extending from the control plate to the second part of the third wall and spaced from the first arm.

Example 28

The method of example 27, further including forming a fourth metal layer over the second metal layer, where the first element further includes: a first metal line located in the fourth metal layer and secured to the first arm; and a second metal line located in the fourth metal layer and secured to the second arm, the first metal line formed of a material having a different coefficient of thermal expansion than the first arm and the second metal line formed of a material having a different coefficient of thermal expansion than the second arm.

What is claimed is:

1. An integrated circuit comprising:
a substrate;
a first metal layer disposed horizontally over the substrate;
a second metal layer disposed horizontally over the first metal layer; and
a controllable capacitive device comprising a first element extending between a first metallic wall and a second metallic wall, the first metallic wall and the second metallic wall extending vertically between the first metal layer and the second metal layer;
wherein the first metallic wall comprises a first part, and a second part electrically insulated from the first part; and wherein the first element comprises:
a control plate located substantially midway between the first and second metallic walls,
a first arm located within the second metal layer and extending between the control plate and the first part of the first metallic wall, and
a second arm located within the second metal layer and extending between the control plate and the second part of the first metallic wall, the first arm being spaced from the second arm.

2. The integrated circuit of claim 1, wherein the first element further comprises:
a first metal line located in a third layer disposed over the second metal layer and secured to the first arm; and
a second metal line located in the third layer and secured to the second arm, the first metal line formed of a material having a different coefficient of thermal expansion than the first arm and the second metal line formed of a material having a different coefficient of thermal expansion than the second arm.

3. The integrated circuit of claim 2, wherein the first arm comprises aluminum and the first metal line comprises tungsten.

4. The integrated circuit of claim 2, wherein the first arm comprises copper.

5. The integrated circuit of claim 4, further comprising a first generator circuit coupled between the first part of the first metallic wall and the second part of the first metallic wall.

6. The integrated circuit of claim 5, wherein the first generator circuit is configured to raise a temperature of the controllable capacitive device by inducing a current that flows through the first arm, the control plate, and the second arm.

7. The integrated circuit of claim 1, wherein the controllable capacitive device further comprises:
a second element extending for a first length in cantilever fashion from the control plate, the second element comprising a movable electrode;
a fixed electrode located at the first metal layer and facing the movable electrode; and
a fixed control electrode located at the first metal layer and facing the control plate.

8. The integrated circuit of claim 7, wherein the second element has a first width in a direction perpendicular to the first length, the movable electrode has a second width in a direction parallel to the first width, the second width being larger than the first width.

9. The integrated circuit of claim 7, wherein the first element is controllable in flexion from the control plate.

10. The integrated circuit of claim 9, further comprising a second generator circuit configured to control a distance between the movable electrode and the fixed electrode by applying a voltage to the fixed control electrode.

11. An integrated circuit comprising:
a substrate;
a first metal layer disposed over the substrate;
a second metal layer disposed over the first metal layer; and
a controllable capacitive device comprising a first element extending between a first fixing zone and a second fixing zone, the first element being controllable in flexion from a control zone, the first element comprising
a first arm,
a second arm spaced from the first arm, the first and second arms forming a U shape with the control zone,
a first metal line located in a third layer disposed over the second metal layer and secured to the first arm, and
a second metal line located in the third layer and secured to the second arm, the first metal line formed of a material having a different coefficient of thermal expansion than the first arm and the second metal line formed of a material having a different coefficient of thermal expansion than the second arm.

12. The integrated circuit of claim 11, wherein the first arm comprises aluminum and the first metal line comprises tungsten.

13. The integrated circuit of claim 11, further comprising a first generator circuit configured to raise a temperature of the controllable capacitive device by inducing a current that flows through the first arm and the second arm.

14. The integrated circuit of claim 11, wherein the controllable capacitive device further comprises a second element extending in cantilever fashion from the control zone, the second element comprising a movable plate at a free end of the second element.

15. The integrated circuit of claim 14, wherein the controllable capacitive device further comprises:
a fixed electrode facing the movable plate; and
a fixed control electrode facing the control zone.

16. The integrated circuit of claim 14, wherein
the first element has a first width and a first length, the first length being larger than the first width;
the second element has a second width measured in a direction parallel to the first length; and
the movable plate having a third width measured in a direction parallel to the second width, the third width being larger than the second width.

17. An integrated circuit comprising:
a substrate;
a first metal layer disposed over the substrate;
a second metal layer disposed over the first metal layer; and
a controllable capacitive device comprising
a first element extending in a first direction between a first fixing zone and a second fixing zone and suspended over a fixed control electrode, the first element comprising
a control plate facing the fixed control electrode,
a first arm formed of a first material having a first coefficient of thermal expansion coefficient, and
a first metal line secured to the first arm and formed of a second material having a second coefficient of thermal expansion coefficient, the first coefficient of thermal expansion coefficient being different than the second coefficient of thermal expansion coefficient, and
a second element extending in cantilever fashion from the control plate and having a first width measured on the first direction, the second element comprising a movable plate at a free end of the second element, the movable plate having a second width measured on the first direction, wherein the second width is larger than the first width.

18. The integrated circuit of claim 17, wherein the first arm comprises aluminum and the first metal line comprises tungsten.

19. The integrated circuit of claim 17, further comprising a first generator circuit configured to raise a temperature of the controllable capacitive device by inducing a current that flows through the first arm.

20. The integrated circuit of claim 17, further comprising a second generator circuit configured to control a distance between the movable plate and a fixed electrode by applying a voltage to the fixed control electrode.

21. A method of fabricating an integrated circuit, the method comprising:
- disposing a first metal layer over an insulating region, wherein the first metal layer forms a lower wall, and wherein the first metal layer comprises a first fixed body, a second fixed body, a third fixed body, a first metallic portion, and a second metallic portion, wherein the first fixed body, the second fixed body, the third fixed body, the first metallic portion and the second metallic portion are spaced apart from each other;
- forming a first insulating layer over the first metallic portion;
- forming a first appendage over the first fixed body and a second appendage over the second fixed body;
- forming a first dielectric portion over the first appendage and a second dielectric portion over the second appendage;
- forming a second insulating layer over the first insulating layer and over the first and second dielectric portions, wherein the first insulating layer and the second insulating layer form a first inter-metal insulating region;
- forming a first via over the first metallic portion and a second via over the second metallic portion;
- disposing a second metal layer over the first inter-metal insulating region, wherein the second metal layer comprises a third metallic portion disposed over the first via, a fourth metallic portion disposed over the second via, and a suspended structure;
- forming a second inter-metal insulating region over the second metal layer;
- forming a third via over the third metallic portion and a fourth via over the fourth metallic portion, wherein the first via, third metallic portion and third via form a first wall, and the second via, fourth metallic portion, and fourth via form a second wall;
- forming a third metal layer over the second inter-metal insulating region, wherein the third metal layer comprising orifices, wherein the third metal layer forms a cowl, and wherein the lower wall, the first wall, the second wall, and the cowl form a housing; and
- removing the first and second inter-metal insulating region to form a cavity in the housing to form a hollow housing.

22. The method of claim 21, wherein the first inter-metal insulating region comprises silicon dioxide, and the first and second dielectric portions comprise silicon nitride.

23. The method of claim 21, wherein forming the first appendage and the second appendage comprises etching and deposition of metal followed by mechanical-chemical polishing.

24. The method of claim 21, wherein removing the first and second dielectric portions comprise silicon nitride comprises performing a wet etching step.

25. The method of claim 24, wherein performing the wet etching step comprises flowing hydrofluoric acid through the orifices.

26. The method of claim 21, further comprising:
- forming a third wall and a fourth wall opposite the third wall, wherein the hollow housing further comprises the third and fourth walls, and wherein the second metal layer further comprises a first element extending from the third wall to the fourth wall, the first element comprising a control plate facing the third fixed body, the third fixed body disposed between the first fixed body and the second fixed body.

27. The method of claim 26, wherein the third wall comprises a first part and a second part electrically insulated from the first part, and wherein the first element further comprises:
- a first arm extending from the control plate to the first part of the third wall; and
- a second arm extending from the control plate to the second part of the third wall and spaced from the first arm.

28. The method of claim 27, further comprising forming a fourth metal layer over the second metal layer, wherein the first element further comprises:
- a first metal line located in the fourth metal layer and secured to the first arm; and
- a second metal line located in the fourth metal layer and secured to the second arm, the first metal line formed of a material having a different coefficient of thermal expansion than the first arm and the second metal line formed of a material having a different coefficient of thermal expansion than the second arm.

* * * * *